(12) United States Patent
Hinterberger et al.

(10) Patent No.: US 10,539,628 B2
(45) Date of Patent: Jan. 21, 2020

(54) MONITORING A STATE VARIABLE OF AT LEAST ONE BATTERY CELL OF A BATTERY

(71) Applicant: AUDI AG, Ingolstadt (DE)

(72) Inventors: Michael Hinterberger, Großmehring (DE); Berthold Hellenthal, Schwanstetten (DE)

(73) Assignee: AUDI AG, Ingolstadt (DE)

( * ) Notice: Subject to any disclaimer, the term of this patent is extended or adjusted under 35 U.S.C. 154(b) by 273 days.

(21) Appl. No.: 15/551,402

(22) PCT Filed: Feb. 15, 2016

(86) PCT No.: PCT/EP2016/053178
§ 371 (c)(1),
(2) Date: Aug. 16, 2017

(87) PCT Pub. No.: WO2016/131779
PCT Pub. Date: Aug. 25, 2016

(65) Prior Publication Data
US 2018/0031640 A1  Feb. 1, 2018

(30) Foreign Application Priority Data

Feb. 18, 2015 (DE) .................. 10 2015 002 150

(51) Int. Cl.
*G01R 31/396* (2019.01)
*H01M 10/48* (2006.01)
(Continued)

(52) U.S. Cl.
CPC ........ *G01R 31/396* (2019.01); *H01M 2/1077* (2013.01); *H01M 10/425* (2013.01);
(Continued)

(58) Field of Classification Search
CPC .............. G01R 31/396; H01M 2/1077; H01M 2/0262; H01M 10/425; H01M 10/4285;
(Continued)

(56) References Cited

U.S. PATENT DOCUMENTS 8,717,186 B2 * 5/2014 Zhou ................... H01M 10/482
340/636.11
9,151,205 B2 * 10/2015 Huq ........................ F01N 11/00
(Continued)

FOREIGN PATENT DOCUMENTS

CN   104103863 A   10/2014
DE   102009000336 A1   7/2010
(Continued)

OTHER PUBLICATIONS

Examination Report dated Nov. 4, 2015 of corresponding German application No. 102015002150.8; 4 pgs.
(Continued)

*Primary Examiner* — Melissa J Koval
*Assistant Examiner* — Rahul Maini
(74) *Attorney, Agent, or Firm* — Maier & Maier, PLLC

(57) ABSTRACT

A method for monitoring a state variable of at least one battery cell of a battery. The battery has at least two battery cells that are arranged adjacent to one another. A first electrically conductive surface is provided at a boundary surface of a first battery cell and a second electrically conductive surface is provided at a boundary surface of a second battery cell. The electrically conductive surfaces are arranged electrically insulated from each other. An electrical voltage is applied between the two electrically conductive surfaces. An electrical variable produced due to an effect of the electrical voltage is analyzed. The state variable on the basis of the analysis is determined.

11 Claims, 3 Drawing Sheets

(51) Int. Cl.
*H01M 2/10* (2006.01)
*H01M 10/42* (2006.01)
*H01M 10/06* (2006.01)
*H01M 2/02* (2006.01)

(52) U.S. Cl.
CPC ..... *H01M 10/4285* (2013.01); *H01M 10/482* (2013.01); *H01M 2/0262* (2013.01); *H01M 10/06* (2013.01); *H01M 2010/4271* (2013.01); *H01M 2010/4278* (2013.01); *H01M 2220/20* (2013.01); *Y02E 60/126* (2013.01)

(58) Field of Classification Search
CPC ............... H01M 10/482; H01M 10/06; H01M 2010/4271; H01M 2010/4278; H01M 2220/20; Y02E 60/126
USPC .......................................................... 324/434
See application file for complete search history.

(56) References Cited

U.S. PATENT DOCUMENTS

| | | | | |
|---|---|---|---|---|
| 9,203,118 | B2* | 12/2015 | Lenz | H01M 10/482 |
| 2004/0247994 | A1* | 12/2004 | Masuda | H01M 10/48 |
| | | | | 429/66 |
| 2011/0234166 | A1 | 9/2011 | Liu et al. | |
| 2014/0002269 | A1 | 1/2014 | Zhou | |
| 2014/0302352 | A1 | 10/2014 | Lenz et al. | |
| 2016/0149270 | A1* | 5/2016 | Albert | H01M 10/482 |
| | | | | 429/7 |
| 2017/0092997 | A1* | 3/2017 | Fukuda | H01M 10/482 |

FOREIGN PATENT DOCUMENTS

| | | |
|---|---|---|
| DE | 102012113078 A1 | 6/2014 |
| DE | 102013203104 A1 | 8/2014 |
| DE | 102013207508 A1 | 10/2014 |
| DE | 102014101391 A1 | 10/2014 |

OTHER PUBLICATIONS

International Search Report dated Mar. 30, 2016 of corresponding International application No. PCT/EP2016/053178; 15 pgs.
Notification of Transmittal of Translation of the International Preliminary Report on Patentability dated Aug. 31, 2017, in connection with corresponding international application No. PCT/EP2016/053178 (8 pages).
Chinese Office Action dated Sep. 16, 2019, in connection with corresponding CN Application No. 201680009441.5 (23 pgs., including machine-generated English translation).

* cited by examiner

MONITORING A STATE VARIABLE OF AT LEAST ONE BATTERY CELL OF A BATTERY

FIELD

The present invention relates to a method for monitoring a state variable of at least one battery cell of a battery, wherein the battery has at least two battery cells that are arranged adjacent to one another. The invention also relates to a monitoring device for monitoring a state variable of at least one battery cell of a battery, wherein the battery has at least two battery cells that are arranged adjacent to one another. The invention further relates to a battery having at least two battery cells arranged adjacent to one another as well as to a motor vehicle with an electrical drive device and with an electrical system connected to the electrical drive device for supplying electrical energy to the electrical drive device, which has a battery that has at least two battery cells that are arranged adjacent to one another.

BACKGROUND

Methods for monitoring a state variable of at least one battery cell of a battery as well as monitoring devices for this purpose are known in basic principle, so that a separate documentation of publications for this is not needed. Such battery cells or batteries are often employed in high-voltage battery systems, such as are used, for example, in electrically drivable motor vehicles or the like. At the present time, different quality inspections are carried out during the production of battery cells as well as of batteries assembled from them, such as, for example, an insulation measurement, a dielectric strength measurement, and/or the like. Beyond this, high-voltage battery systems often have an insulation monitoring device for active checking of the isolation or insulation of the high-voltage battery system. This device checks both a high-voltage plus connection terminal and a high-voltage minus connection terminal with respect to a ground of a device, such as, for example, the motor vehicle that comprises the high-voltage battery. When the high-voltage battery is employed in a motor vehicle, the insulation is monitored in relation to a motor vehicle ground.

Corresponding batteries that are formed from at least two battery cells are also known from the prior art.

A battery cell is a device that has two electrodes that interact electrochemically with each other. The interaction can occur with supplemental assisting action of an electrolyte. Battery cells, which are also referred to as galvanic cells, are preferably reversible in terms of their function, such as when they are utilized, for example, for batteries in the form of rechargeable batteries. On account of the electrochemical interaction of the electrodes, a direct current voltage that is specific to the battery cell chemistry is established at the electrodes and is supplied by way of connection terminal contacts of the respective battery cell that are connected to the electrodes.

This direct current voltage is, as a rule, relatively small. Many applications in electronics necessitate a direct current voltage that markedly exceeds the direct current voltage that can be supplied by a single battery cell. For this reason, a plurality of battery cells are often combined to form a battery and connected electrically inside the battery in accordance with the electrical requirements, for example, in the form of a series connection, a parallel connection, combinations thereof, or the like.

Inside the battery, the individual battery cells are therefore often connected to one another in an electrically conductive manner by means of bus bars or similar electrical conductors in the desired type of circuit, in order to be able to provide the desired direct current voltage at the connection terminal poles of the battery. Such batteries are employed, for example, as lead acid batteries in the motor vehicle sector, as nickel cadmium batteries in the aircraft sector, and, for interruption-free current supplies, as lithium ion batteries in the field of small household appliances and/or the like, but recently also in electrically driven vehicles.

Motor vehicles of the generic type are also well known. They preferably comprise motor vehicles that have an electrical system with a battery as well as a drive device connected to the electrical system. Such motor vehicles are, for example, electric vehicles, hybrid vehicles, in which a drive is possible both by means of an electric drive device and also by means of an internal combustion engine, or the like. In these vehicles, the battery and the drive device each have at least two electrical connection terminal contacts. For the purpose of the electrical coupling, at least one of the connection terminal contacts of the battery and one of the connection terminal contacts of the drive device are connected by means of an electrically conductive line to each other in an electrically conductive manner.

During the operation of battery cells or batteries of the generic type, problems can arise, particularly in regard to the intended operation, aging, and/or the like. This can be detrimental to the quality of the battery cells or of the battery.

SUMMARY OF THE DISCLOSURE

The object of the invention is to present a method for monitoring a state variable of at least one battery cell of a battery, a monitoring device for this purpose, a battery, and a motor vehicle having a battery, for which it is possible, in a simple and precise way, to make a statement regarding the quality of the battery cell or of the battery formed from the battery cells.

To achieve this by the invention, a method is proposed according to claim 1 as well as a monitoring device according to the further independent claim 8. In addition a battery is proposed according to the further independent claim 9.

Finally, a motor vehicle according to the further independent claim 11 is also proposed.

Other advantageous embodiments of the invention ensue on the basis of features of the dependent claims.

By means of the invention, in particular, a method of the generic type that comprises the following steps is proposed:
provision of a first electrically conductive surface at a boundary surface of a first of the at least two battery cells and provision of a second electrically conductive surface at a boundary surface of a second of the at least two battery cells, wherein the electrically conductive surfaces are arranged electrically insulated from each other;
application of an electrical voltage between the two electrically conductive surfaces;
analysis of an electrical variable produced due to an effect of the electrical voltage; and
determination of the state variable on the basis of the analysis.

It is proposed in regard to a monitoring device that, in particular, the monitoring device is designed to apply an electrical voltage between a first electrically conductive surface, which is provided at a boundary surface of a first of the at least two battery cells, and a second electrically conductive surface, which is provided at a boundary surface of a second of the at least two battery cells, to analyze an electrical variable produced due to an effect of the electrical voltage, and to determine the state variable on the basis of the analysis.

In terms of the battery, it is proposed, in particular, that a boundary surface of a first of the at least two battery cells has a first electrically conductive surface and a boundary surface of a second of the at least two battery cells has a second electrically conductive surface, wherein the electrically conductive surfaces are arranged electrically insulated from each other, wherein the battery has a monitoring device that is designed to apply an electrical voltage between the two electrically conductive surfaces, to analyze an electrical variable produced due to an effect of the electrical voltage, and to determine the state variable on the basis of the analysis.

In terms of the motor vehicle, it is proposed, in particular, that a boundary surface of a first of the at least two battery cells has a first electrically conductive surface and a boundary surface of a second of the at least two battery cells has a second electrically conductive surface, wherein the electrically conductive surfaces are arranged electrically insulated from each other, wherein the battery has a monitoring device that is designed to apply an electrical voltage between the two electrically conductive surfaces, to analyze an electrical variable produced due to the effect of the electrical voltage, and to determine the state variable on the basis of the analysis.

The invention makes use of the realization that, for example, an insulating material of the battery or of the battery cell can be subject to aging. Beyond this, the battery cell or the battery can also alter its geometric dimensions depending on the aging and the respective operating state. In lithium ion batteries, for example, among other things, a volume increase occurs with increasing aging and/or also depending on the state of charge of the battery. In the case of prismatic battery cells, this can manifest itself in the form of a bulging behavior. This can lead, among other things, to a change in the insulating material between the adjacent battery cells over the course of its service life.

The state variable is preferably a state variable characterizing the quality state of the battery cell or of the battery, such as, for example, a state of aging, a capacitance state, dimensions of the battery cells or of the battery, and/or the like. Beyond this, the state variable of course, can also be a no-load voltage of the respective battery cells or of the battery, a state of charge of the battery, in particular of the individual battery cells of the battery, and/or the like. Furthermore, the state variable can also be a temperature, in particular a temperature of the battery cell, a pressure, in particular a pressure in the battery cell, and/or the like.

The battery cells of the battery are arranged adjacent to one another; preferably they border one another directly.

The invention is based on the further realization that the change of the state variable affects the geometry of the battery cell or of the battery. This change of the geometry can be determined capacitively by means of electrically conductive surfaces at boundary surfaces of the respective battery cells. For this purpose, the invention provides that a first electrically conductive surface is provided at a boundary surface of a first of the at least two battery cells and a second electrically conductive surface is provided at a boundary surface of a second of the at least two battery cells. The electrically conductive surfaces are arranged electrically insulated from each other. As a result of this, an electrical capacitance is created, which, as will be discussed further below, can serve in the analysis for the purpose of determining the state variable.

The arrangement of the electrically conductive surfaces, for example, can be arranged electrically insulated by an insulating film, an oxide layer, an insulating washer, combinations thereof, and/or the like. The electrically insulated arrangement of the first and of the second electrically conductive surface with respect to each other makes it possible to provide the electrical capacitance and to be able to determine a value of the electrical capacitance. In the process, it is not absolutely essential for the invention that the two electrically conductive surfaces are equal in size and/or are arranged directly lying opposite to each other. The electrically conductive surfaces can deviate from each other in terms of their size and shape, but they can also be displaced with respect to each other, and/or the like.

In accordance with the invention, an electrical voltage is applied at the two electrically conductive surfaces. In this regard, the electrically conductive surfaces can have connection terminal contacts or the like, which make it possible to connect a corresponding voltage generator at the electrically conductive surfaces.

Beyond this, it can be provided, of course, that, in the case of a plurality of battery cells, preferably each of the battery cells has electrically conductive surfaces of this kind, wherein a monitoring device is designed in such a way that it can apply the electrical voltage to different electrically conductive surfaces. As a result of this, it is possible to obtain reference values in relation to other battery cells of the battery and, in this way, to make a quality statement both in relation to the entire battery and also in relation to the individual battery cells.

The electrical voltage can be, for example, a voltage pulse or else a voltage pulse sequence. Beyond this, the electrical voltage can also be an alternating current voltage, such as, for example, a high-frequency alternating current voltage. The alternating current voltage can be designed to be sinusoidal, rectangular, or triangular as well as combinations thereof or the like. Of course, the voltage pulse can also be an alternating current voltage. In a dual manner, it is also possible in basic principle, of course, for a current pulse or an alternating current to be applied to the electrically conductive surfaces. In accordance therewith, the voltage generator would be replaced by a current generator.

By means of an analysis unit, it is possible to determine the effect of the electrical voltage on an electrical variable produced by the electrical voltage. Preferably, this is the electric current. The analysis unit determines, first of all, a value of the capacitance formed by the electrically conductive surfaces. From this value, the analysis unit derives the respectively desired state variable, advantageously taking into further consideration other parameters of the battery cell or of the battery. The further parameters can be determined, for example, by sensors internal to the cells, preferably in conjunction with a suitable analysis unit. For this purpose, the analysis unit is in communications link with the further sensor units. The further sensor units can record, for example, a temperature of the battery cell, a pressure of the battery cell, a specific gravity of an electrolyte, a no-load voltage, an internal resistance, and/or the like.

It has proven to be especially advantageous when the analysis unit can compare the determined state variable with state variables that have already been determined beforehand. Beyond this, it is advantageous when a reference value is provided for the determined state variable. The analysis unit can then compare the determined state variable with the reference value or else with state variables determined beforehand in order to be able to use this comparison to obtain information on the current state variable. For example, in this way, the analysis unit can determine an aging curve of the battery cell or of the battery.

It is further proposed that, by means of the analysis, it is possible to determine an electrical capacitance and/or an electric resistance between the electrically conductive surfaces. As a result of this, it is possible to determine the desired state variable by means of the analysis unit in a reliable manner. Taking into consideration the electric resistance enables, beyond this, a statement to be made about the insulation and/or the like. From the change in the electric resistance, moreover, it is possible to draw conclusions about aging. For this purpose, the analysis unit can take into account a value of the electric resistance for determination of aging or of another quality variable.

It is further proposed that, in the case of a battery with more than two battery cells, respective electrically conductive surfaces are arranged between all adjacently arranged battery cells, wherein electrically conductive surfaces to which the electrical voltage is to be applied are selected in accordance with a monitoring rule. This embodiment makes it possible to utilize any combinations of electrically conductive surfaces for monitoring of the battery cells in accordance with the monitoring rule. For example, it is possible to apply the electrical voltage jointly to respectively pairwise electrically conductive surfaces of different battery cells. As a result of this, it is even possible through an individual measurement to make a statement about a quality state of all battery cells of the battery. Of course, this can also be implemented solely for a predetermined number of battery cells. This information can be taken, for example, from the monitoring rule. The monitoring rule as such can be, for example, a file, which contains the corresponding information or data for retrieval by the analysis unit. Beyond this, it can also be provided, of course, that the monitoring rule or the data thereof can be retrieved via a communications network, which, in the case of a motor vehicle, can be, for example, a CAN bus, a LIN bus, a flexray bus, or the like. Beyond this, of course, there exists the possibility of retrieving the monitoring rule or corresponding data also via a global communications network, for example, from the Internet or the like. It can further be provided that the monitoring rule or a corresponding file is saved in the analysis unit. As needed, it can be provided that the file is correspondingly updated.

A further embodiment of the invention proposes that the electrically conductive surface is formed in segments from a plurality of surface regions that are electrically insulated from one another, wherein electrical voltage can be applied to the surface regions independently of one another. This embodiment enables local regions of the boundary surface to be recorded in terms of a change. This embodiment has therefore proven to be particularly advantageous in the case when even especially small changes, which are located, for example, solely in a surface region, are to be recorded. As a result of this, the overall accuracy can further be improved. Beyond this, it is possible in this way to obtain supplemental information, which can be taken into account for determining the state variable.

The electrically conductive surfaces can be applied, for example, as metallization at the boundary surface. However, it can also be provided that a metal film is bonded to the boundary surface by means of a bonding method, such as adhesive bonding or the like. Furthermore, there exists, of course, the possibility of creating the electrically conductive surface by a plastic film with a sufficiently large electric conductivity. Such a film can either form the boundary surface itself or else be bonded to it. The same also applies in basic principle to the segmented construction of the electrically conductive surface. It is especially advantageous to be able to apply an electric potential individually to each surface region of the segmented electrically conductive surface, so that a local state variable can be determined. Of course, it can be provided that solely one of the two electrically conductive surfaces is constructed in segments. In this way, the effort involved for a segmented embodiment can be reduced. It has proven to be especially advantageous when the two opposite-lying electrically conductive surfaces are constructed in segments, wherein they preferably have a corresponding segmentation. As a result of this, it is possible to achieve a high recording accuracy.

BRIEF DESCRIPTION OF THE DRAWING

Further advantages and features ensue on the basis of the following description of exemplary embodiments, taking into consideration the appended figures. In the figures, identical reference numbers refer to identical features and functions.

Shown are.

DETAILED DESCRIPTION OF THE DRAWING

Figure 1:
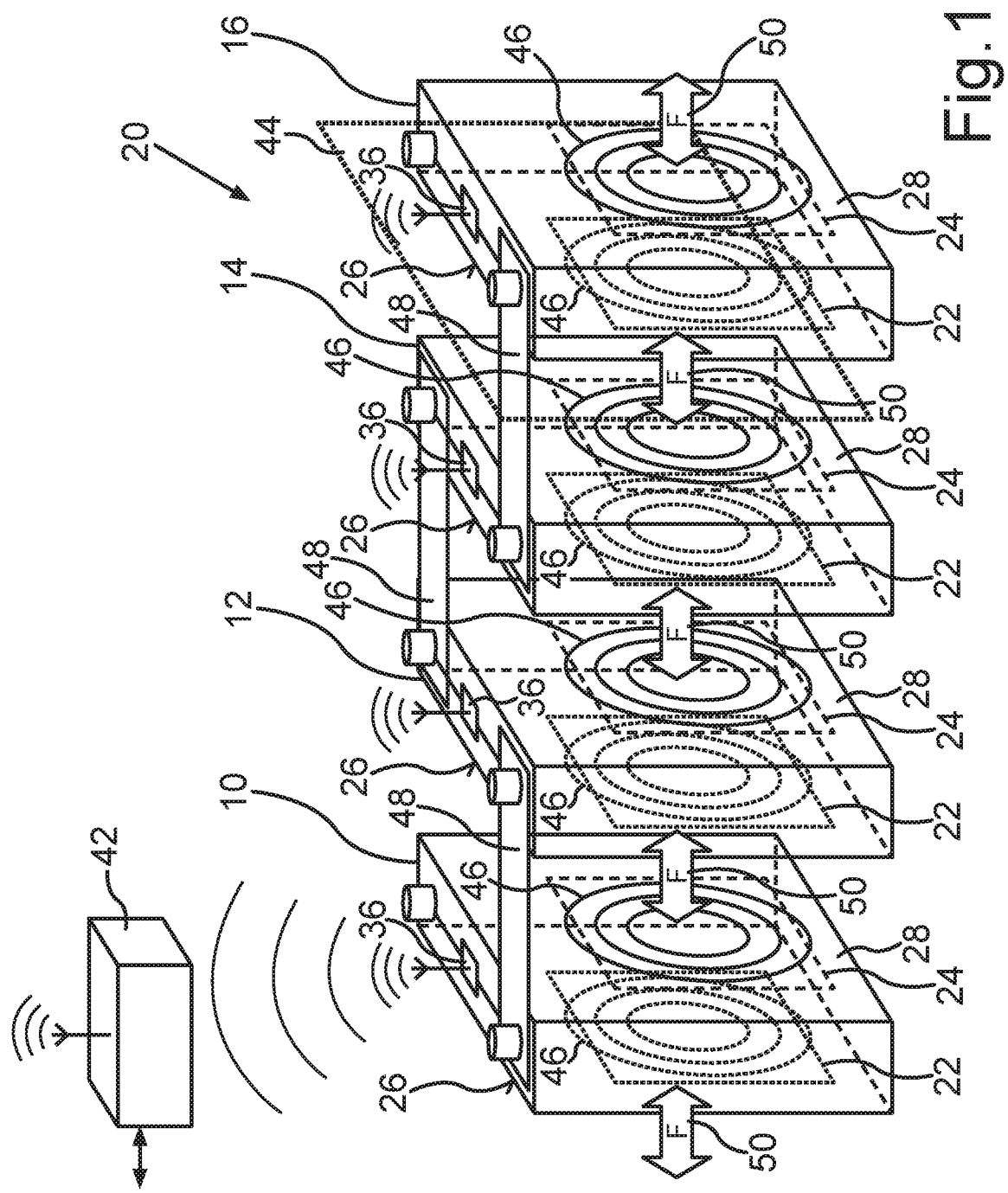
FIG. 1 in a schematic perspective view, a cutout of a first embodiment for a battery cell with battery cells in accordance with the invention, FIG. 2 a schematic circuit diagram view of the arrangement in accordance with FIG. 1, and FIG. 3 a schematic perspective view of a second embodiment of a battery with battery cells in accordance with the invention.

FIG. 1 shows, in a schematic perspective view, a cutout of a battery 20 with battery cells arranged adjacent to one another, of which, solely in cutout, the battery cells 10, 12, 14, and 16 are illustrated by way of example. In the present embodiment, the battery 20 is a rechargeable battery, which, in a motor vehicle that is not illustrated, is a component of the electrical system thereof and serves for supplying electrical energy to an electrical drive device of the motor vehicle.

In the present case, the battery cells 10, 12, 14, 16 are connected in series and connected correspondingly with current bus bars 48 in an electrically conductive manner. Each of the battery cells 10, 12, 14, 16 is designed, in the present case, as a lithium ion cell and has an essentially cubic outer structure. The cubic structure provides opposite-lying lateral boundary surfaces 26, 28. The boundary surfaces 26, 28 are formed, in the present case, from an electrically insulating material, which, in the present case, is a plastic. Attached by means of an adhesive bonding at the boundary surfaces 26, 28 are respectively a first and a second electrically conductive surface 22, 24. The electrically conductive surfaces 22, 24 are arranged electrically insulated from each other and, namely, not only in relation to the respective battery cell 10, 12, 14, 16, but also in relation to the respectively opposite-lying electrically conductive surfaces 22, 24 of the respective adjacent battery cells 10, 12, 14, 16. In the present case, it is provided that, between the opposite-lying electrically conductive surfaces 22, 24 of adjacent battery cells 10, 12, 14, 16, a respective electrically insulating film 44, formed from an insulating material, which, in the present case, is a polyamide, is arranged. In the present embodiment, it is provided that the boundary surfaces 26, 28 border each other with the respective electrically conductive surfaces 22, 24 of adjacent battery cells 10, 12, 14, 16 directly via the respective insulating film 44.

Via electrical connection terminals, which are not illustrated, the electrically conductive surfaces 22, 24 of a respective battery cell 10, 12, 14, 16 are connected to a monitoring device 36 of the respective battery cell 10, 12, 14, 16. The respective monitoring device 36 provides a voltage generator as well as an analysis unit, which is not illustrated further, by means of which the effect of application of voltage to opposite-lying electrically conductive surfaces 22, 24 of adjacent battery cells 10, 12, 14, 16 can be determined. In the embodiment according to FIG. 1, the voltage generator, which applies a voltage pulse to respectively pairwise opposite-lying electrically conductive surfaces 22, 24 of adjacent battery cells 10, 12, 14, 16, is not illustrated. Via a switching device, which is likewise not illustrated, the voltage pulse can be applied to any opposite-lying electrically conductive surfaces 22, 24.

The monitoring devices 36 cause the voltage generator to apply a corresponding voltage at a respectively selected pair of electrically conductive surfaces 22, 24. The monitoring devices 36 of the battery cells 10, 12, 14, 16 are in near-field communications link with one another—in the present case in accordance with a WLAN standard. Alternatively, it is also possible in another embodiment to provide a wired communications link when, for example, the boundary conditions do not allow a communications link via radio frequency in a reliable manner. Beyond this, it is also possible, of course, to provide a medium different from radio frequency for a wireless communications link, for example one based on ultrasound, infrared, or the like. Combinations thereof can also be provided.

The monitoring devices 36 exchange their data via the communications link. As a result of this, it is possible, on account of the application of voltage, to determine a current flow as the electrical variable produced by the effect of the electrical voltage and, from said current flow, then to determine a state variable on the basis of the analysis. In the present case, the state variable is a volume change over the lifetime of the battery 20 or of the battery cells 10, 12, 14, 16. The monitoring devices 36 are further in communications link with a battery management system 42, which, on its part, is connected to a CAN bus of the motor vehicle, which is not illustrated.

For this purpose, the invention utilizes the determination of the capacitance of a plate capacitor formed by the opposite-lying electrically conductive surfaces 22, 24 of adjacent battery cells 10, 12, 14, 16. Through the active determination of the electrical capacitance thereof between the battery cells 10, 12, 14, 16, there exists the possibility of drawing a conclusion about the quality of, on its part, the insulating film 44 between the battery cells 10, 12, 14, 16. In the present case, the electrical capacitance is essentially defined by the separating distance of the electrically conductive surfaces 22, 24 as well as by the dielectric medium formed by the insulating film 44. On the other hand, it is possible, among other things, to draw a conclusion about a volume change behavior, in particular a bulging behavior of the battery cells 10, 12, 14, 16, or about a possible change in the insulating film 44 between the battery cells 10, 12, 14, 16 throughout the lifetime or said behavior can be actively recorded, measured, and checked.

Via the capacitive coupling between the battery cells 10, 12, 14, 16, it is also possible to determine the separating distance between the battery cells 10, 12, 14, 16 and accordingly to derive from this, taking into consideration the further battery cell neighbors, also a volume change of the respective battery cells 10, 12, 14, 16. Beyond this, an internal pressure of the respective battery cells 10, 12, 14, 16 can be determined.

The invention further makes it possible to conclude from the determination of capacitance that a force is developed between the battery cells 10, 12, 14, 16.

Beyond this, it is also possible in connection with an active balancing of the battery cells 10, 12, 14, 16 and the determination of capacitance in accordance with the invention to draw a conclusion about a transmitted quantity of energy, power losses, efficiency, and the like.

In FIG. 1, such a bulging is illustrated by means of elliptical circles 46 at the respective boundary surfaces 26, 28. This bulging results in forces that are indicated by the force arrows 50. As a result of the bulging, the capacitance between the electrically conductive surfaces 22, 24 of adjacent battery cells 10, 12, 14, 16 changes, so that, by means of the respective monitoring devices 36, a corresponding change in capacitance can be determined. The determined change in capacitance can, as indicated previously, be employed for the determination of the respective state variable.

Figure 2:
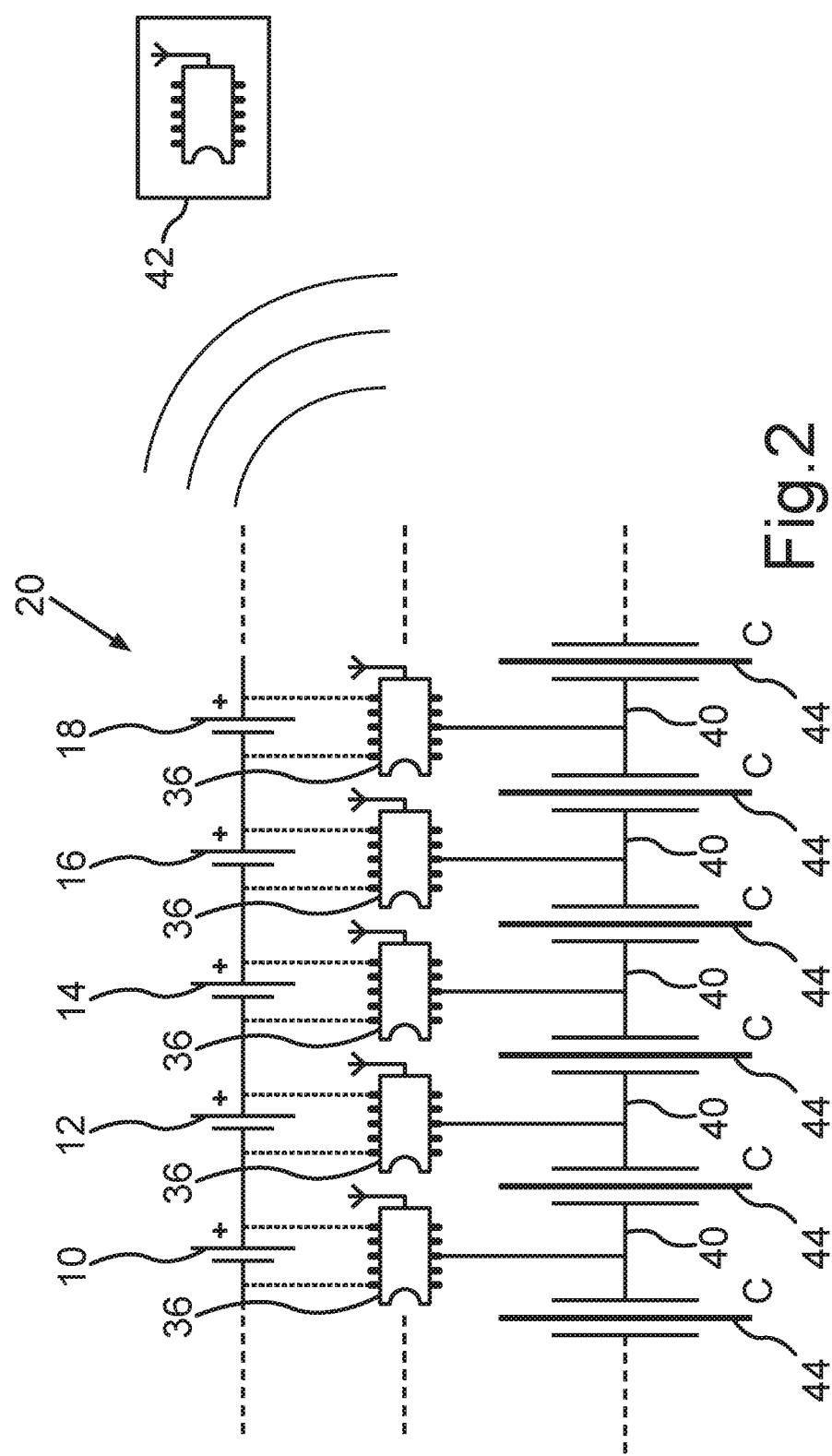

FIG. 2 shows a schematic circuit diagram view of an embodiment of the invention, which is based on the principle in accordance with FIG. 1, wherein, in the present case, in contrast to the embodiment in accordance with FIG. 1, the boundary surfaces 26, 28 are provided by a metal cup as housing 40. Further illustrated is another battery cell 18, which is constructed like the other battery cells 10, 12, 14, 16. The electrically conductive surfaces 22, 24 of a respective battery cell 10, 12, 14, 16, 18 are insofar each connected with one another in an electrically conductive manner and arranged electrically insulated by way of the insulating films 44 from the corresponding electrically conductive surfaces 22, 24 of adjacent battery cells 10, 12, 14, 16, 18. Here, too, the housing 40 is attached at the respective monitoring devices 36, which, in the present case, serve not only for analysis, but additionally also for recording further state variables of the respective battery cells 10, 12, 14, 16, 18. Here, too, the monitoring devices 36 are again in near-field communications link with one another as well as also in communications link via radio frequency by use of a battery management system 42, which, on its part, is connected to a CAN bus, which is not illustrated.

In the embodiment in accordance with FIG. 2, the housing 40 is arranged electrically insulated from the electrodes and their respective connection terminal contacts of the battery cells 10, 12, 14, 16, 18.

Even when, in the present case, in accordance with FIG. 2, an electric insulation of the housing 40 with respect to the electrodes or electrical connection terminal contacts of the respective of the battery cells 10, 12, 14, 16, 18 is provided, it is possible, in alternative embodiments, of course, also to provide that one of the electrodes is connected to the housing in an electrically conductive manner. In this case, it is then possible to attach respective electrically conductive surfaces 22, 24 to the housing, as illustrated in connection with FIG. 1.

The electrically conductive surfaces can be formed in basic principle by a metallization, which is applied on the respective boundary surface 26, 28. Beyond this, there exists, of course, the possibility of providing the electrically conductive surfaces 22, 24 also by electrically conductive films, which are placed on the respective boundary surface 26, 28 or fastened to it. For example, a metal film or an electrically conductive plastic film can be provided in order to form the electrically conductive surface 22, 24. This film is preferably adhesively attached or similarly fastened to the respective boundary surface 26, 28. Of course, combinations hereof can also be provided.

Figure 3:
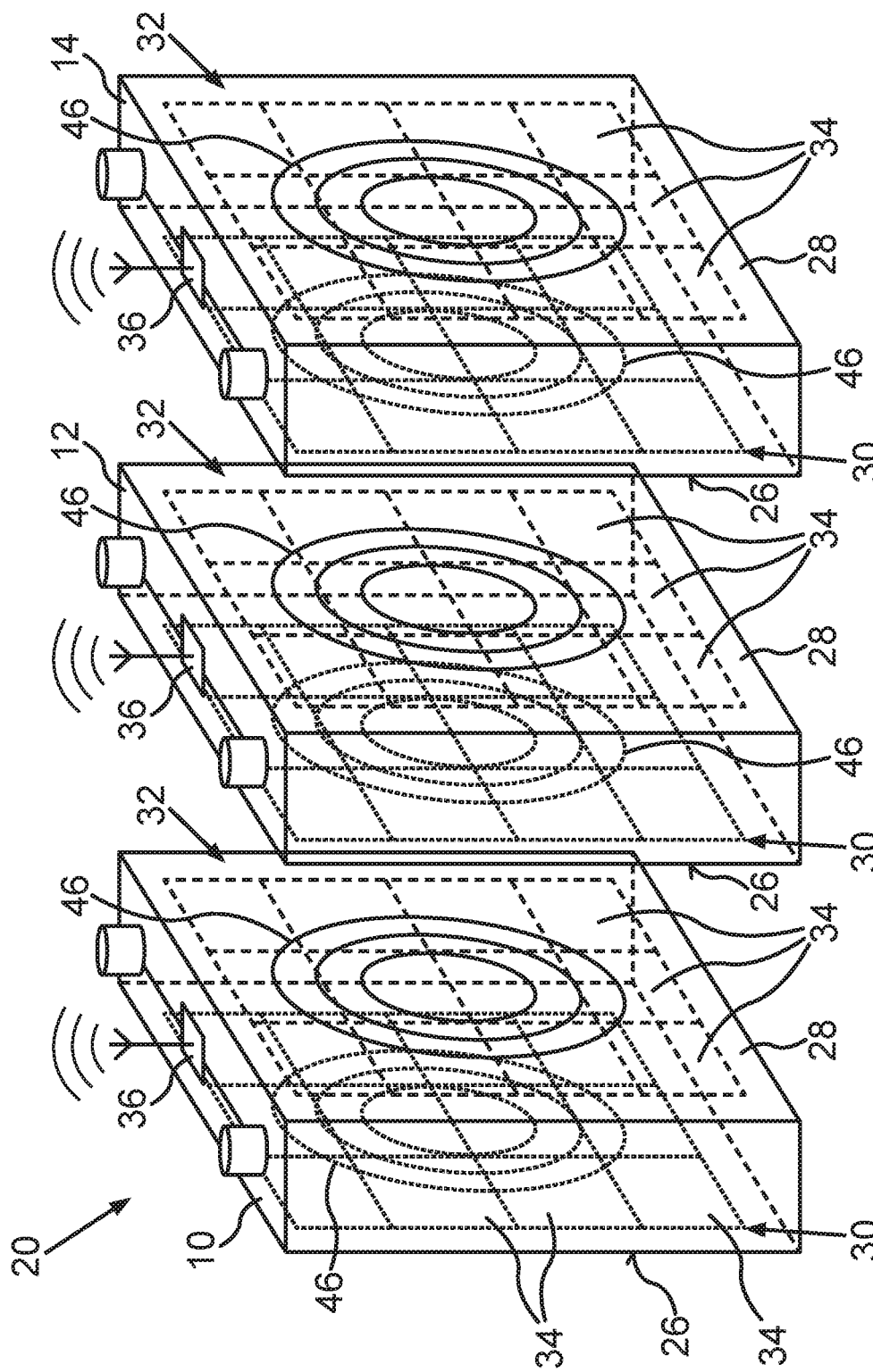

FIG. 3 shows a further embodiment of the invention, wherein, in FIG. 3, in a schematic perspective view, a cutout of a battery 20 with battery cells 10, 12, 14 is illustrated. In basic principle, the embodiment in accordance with FIG. 3 is based on that of FIG. 1, for which reason reference is made supplementally to the statements in regard to the exemplary embodiment in accordance with FIG. 1. In the following, solely the differences from the preceding exemplary embodiment in accordance with FIG. 1 are discussed.

In contrast to the exemplary embodiment in accordance with FIG. 1 it is provided in the exemplary embodiment in accordance with FIG. 3 that the electrically conductive surfaces 22, 24 are constructed in segments and form a plurality of surface regions 34 that are electrically insulated from one another. In this case, the electrically conductive surfaces are identified by the reference numbers 30 and 32. In basic principle, they correspond to the electrically conductive surfaces 22, 24, as have been discussed in relation to FIG. 1.

The electrically conductive surface regions 34 are arranged electrically insulated with respect to one another. In the present case, it is provided that each of these surface regions 34 can be connected separately to an electric potential of the electrical voltage generator. It is therefore possible to carry out the determination of the state variable in a surface-selective manner. In particular, a determination of capacitance can occur, so that overall a spatial resolution can be achieved in the surface of the boundary surfaces 26, 28. As a result of this, it is possible to determine precisely the geometry of a volume change, in particular of a bulging, as a result of which the accuracy of the determination of the respective state variable can be improved.

In particular, the invention thereby makes it possible, beginning with a startup, to determine a respective state of aging and to derive from this also a respective state of replacement for which a respective battery cell 10, 12, 14, 16, 18 of the battery 20 needs to be replaced. As a result of this, it is possible to determine and/or to monitor a quality state of the battery 20 or of the battery cells 10, 12, 14, 16, 18.

Even though the invention has been explained on the basis of batteries or motor vehicles, it is clear to the person skilled in the art that the application of the invention is not limited to these applications. The invention can also been employed, of course, in stationary electrical systems, in particular also in the field of electric switches. Especially in the latter case, the advantage in accordance with the invention is especially manifested, in particular in the case when the invention is employed for interruption-free energy supply, in particular for functions relevant to safety. This is of great advantage particularly in electrical systems in signal technology or in communications technology.

The description of the exemplary embodiments serves solely for explaining the invention and is not limited to said embodiments.

The advantages and features described for the device according to the invention and for the motor vehicle according to the invention as well as the embodiments apply equally to the corresponding method and vice versa. Consequently, corresponding method features can be provided for device features and vice versa.

The invention claimed is:

1. A method for monitoring a state variable of at least one battery cell of a battery, wherein the battery has at least two battery cells that are arranged adjacent to one another, comprising:
   providing a first electrically conductive surface at a boundary surface of a first of the at least two battery cells and providing a second electrically conductive surface at a boundary surface of a second of the at least two battery cells, wherein the electrically conductive surfaces are arranged electrically insulated from each other;
   providing a wireless communications layer enabling communication between and with the at least two battery cells;
   applying an electrical voltage between the two electrically conductive surfaces;
   analyzing an electrical variable produced due to an effect of the electrical voltage; and
   determining the state variable on the basis of the analysis.

2. The method according to claim 1, wherein the determined state variable is compared with a reference value.

3. The method according to claim 1, wherein an electrical capacitance and an electric resistance between the electrically conductive surfaces is determined.

4. The method according to claim 1, wherein the electrical voltage is formed by at least one voltage pulse.

5. The method according to claim 1, wherein the electrical voltage is formed by an alternating current voltage.

6. The method according to claim 1, wherein in the case of a battery with more than two battery cells, respective electrically conductive surfaces are arranged between all adjacently arranged battery cells, wherein the electrically conductive surfaces to which the electrical voltage is to be applied are selected in accordance with a monitoring rule.

7. The method according to claim 1, wherein at least one of the first and second electrically conductive surfaces is constructed in segments from a plurality of surface regions that are electrically insulated from one another, wherein electrical voltage can be applied to the surface regions independently of one another.

8. A monitoring device for monitoring a state variable of at least one battery cell of a battery, wherein the battery has at least two battery cells that are arranged adjacent to one another, wherein the monitoring device comprises a means for communicating with a wireless communications layer and is designed to apply an electrical voltage between a first electrically conductive surface, which is provided at a boundary surface of a first of the at least two battery cells, and a second electrically conductive surface, which is provided at a boundary surface of a second of the at least two battery cells, which is electrically insulated from the first electrically conductive surface, to analyze an electrical variable produced due to an effect of the electrical voltage, and to determine the state variable on the basis of the analysis.

9. A battery having at least two battery cells arranged adjacent to one another, comprising:
   a boundary surface of a first of the at least two battery cells has a first electrically conductive surface and a boundary surface of a second of the at least two battery cells has a second electrically conductive surface, wherein the electrically conductive surfaces are arranged electrically insulated from each other, wherein the battery has a monitoring device, which comprises a means for communicating with a wireless communications layer and is designed to apply an electrical voltage between the two electrically conductive surfaces, to analyze an electrical variable produced due to an effect of the electrical voltage, and to determine the state variable on the basis of the analysis.

10. The battery according to claim 9, wherein the battery cells are each arranged in an electrically conductive housing and the electrically conductive surfaces are formed by the housing of the battery cells.

11. A motor vehicle with an electrical drive device and with an electrical system connected to the electrical drive device for supplying the electrical drive device with electrical energy, which has a battery that has at least two battery cells that are arranged adjacent to one another, comprising:

a boundary surface of a first of the at least two battery cells has a first electrically conductive surface and a boundary surface of a second of the at least two battery cells has a second electrically conductive surface, wherein the electrically conductive surfaces are arranged electrically insulated from each other, wherein the battery has a monitoring device that comprises a means for communicating with a wireless communication layer and is designed to apply an electrical voltage between the two electrically conductive surfaces, to analyze an electrical variable produced due to an effect of the electrical voltage, and to determine the state variable on the basis of the analysis.

* * * * *